(12) United States Patent
Jiang et al.

(10) Patent No.: US 11,594,655 B2
(45) Date of Patent: Feb. 28, 2023

(54) METHOD FOR AUTOMATIC FILM EXPANSION, STORAGE MEDIUM, AND DEVICE

(71) Applicant: CHONGQING KONKA PHOTOELECTRIC TECHNOLOGY RESEARCH INSTITUTE CO., LTD., Chongqing (CN)

(72) Inventors: Renjie Jiang, Chongqing (CN); Guangwei Zhong, Chongqing (CN); Kaiyi Wu, Chongqing (CN); Ranxiang Yang, Chongqing (CN); Jiahui Shen, Chongqing (CN)

(73) Assignee: CHONGQING KONKA PHOTOELECTRIC TECHNOLOGY RESEARCH INSTITUTE CO., LTD., Chongqing (CN)

(\*) Notice: Subject to any disclaimer, the term of this patent is extended or adjusted under 35 U.S.C. 154(b) by 115 days.

(21) Appl. No.: 17/055,910

(22) PCT Filed: Dec. 2, 2019

(86) PCT No.: PCT/CN2019/122298
§ 371 (c)(1),
(2) Date: Nov. 16, 2020

(87) PCT Pub. No.: WO2021/108942
PCT Pub. Date: Jun. 10, 2021

(65) Prior Publication Data
US 2021/0313484 A1    Oct. 7, 2021

(51) Int. Cl.
*H01L 33/48* (2010.01)
*H01L 25/075* (2006.01)
(Continued)

(52) U.S. Cl.
CPC ...... *H01L 33/0095* (2013.01); *H01L 21/6836* (2013.01); *H01L 22/20* (2013.01); *H01L 2221/68336* (2013.01)

(58) Field of Classification Search
CPC . H01L 33/0095; H01L 22/20; H01L 25/0753; H01L 31/00; H01L 21/6836
See application file for complete search history.

(56) References Cited

U.S. PATENT DOCUMENTS

| 2018/0240941 A1* | 8/2018 | Li ........................ H01L 25/0753 |
| 2019/0088559 A1* | 3/2019 | Hayashishita ............. C09J 7/29 |

FOREIGN PATENT DOCUMENTS

| CN | 103872213 A | 6/2014 |
| CN | 104112691 A | 10/2014 |
(Continued)

OTHER PUBLICATIONS

The First Office Action issued in corresponding CN Application No. CN201980002908.7 dated Jul. 1, 2021.
(Continued)

*Primary Examiner* — Brian Turner
(74) *Attorney, Agent, or Firm* — Hauptman Ham, LLP

(57) ABSTRACT

A method and device for automatic film expansion and a storage medium are provided. The method includes the following. Perform overall stretching on an expanded film. An interval between each two adjacent LED wafers on the expanded film is monitored in real time. When an interval between two adjacent LED wafers on the expanded film is greater than or equal to a preset target interval, stop performing overall stretching, and search the expanded film for a local region where an absolute difference between an interval between two adjacent LED wafers and the preset target interval is greater than a preset error threshold. When the local region exists on the expanded film, perform local stretching on the local region until an absolute difference
(Continued)

between an interval between each two adjacent LED wafers in the local region and the preset target interval is less than or equal to the preset error threshold.

20 Claims, 2 Drawing Sheets

(51) Int. Cl.
    *H01L 21/683*      (2006.01)
    *H01L 33/62*      (2010.01)
    *H01L 33/00*      (2010.01)
    *H01L 21/66*      (2006.01)

(56) References Cited

FOREIGN PATENT DOCUMENTS

| | | |
|---|---|---|
| CN | 204946921 U | 1/2016 |
| CN | 108807236 A | 11/2018 |
| CN | 109256350 A | 1/2019 |
| CN | 109285802 A | 1/2019 |
| CN | 208986018 U | 6/2019 |
| CN | 110429051 A | 11/2019 |
| JP | 2013026544 A | 2/2013 |

OTHER PUBLICATIONS

International Search Report issued in corresponding International Application No. PCT/CN2019/122298, dated Aug. 27, 2020, pp. 1-9, Beijing, China.

\* cited by examiner

METHOD FOR AUTOMATIC FILM EXPANSION, STORAGE MEDIUM, AND DEVICE

RELATED APPLICATION

The present application is a U.S. National Phase of International Application Number PCT/CN2019/122298, filed Dec. 2, 2019.

TECHNICAL FIELD

This disclosure relates to the field of film expansion, and particularly to a method for automatic film expansion, a storage medium, and a device.

BACKGROUND

With the rapid development of modern semiconductor chip technology, especially the gradual maturity of flip chip technology and the diversification of phosphor coating technology, chip packaging technology is also constantly improving. CSP (chip scale package), as the latest generation of chip packaging technology, is conducive to promoting new improvements in technical performances of semiconductor chips.

The process flow of CSP includes die bonding, lamination, dicing, and testing. After lamination, a product is diced into a number of matrix wafers by a precision dicing machine. After dicing, wafers need to be tested, and bin classification needs to be performed. If an interval between two wafers is too small, crosstalk will easily occur during testing, which affects parameters of test beads. To eliminate the above-mentioned effects, generally, before testing, a blue film or a white film provided with LED wafers is first stretched by a film stretching machine to expand intervals between the LED wafers on the film.

In the existing expansion technology, original intervals between the LED wafers are adjusted by fixing a periphery of an LED-wafer expanded film and stretching the expanded film outward by an expansion machine. However, by means of an outward stretching manner merely, not all intervals between LED wafers can effectively reach a desired target interval, which results in a relatively large error between an interval between some LED wafers and a target interval, thus failing to satisfy CSP production and use requirements.

In sum, the existing technology needs to be improved and developed.

SUMMARY

In view of the above deficiencies in the related art, a method for automatic film expansion, a storage medium, and a device are provided, which aims to solve problems of the existing film expansion technology that intervals between LED wafers on an expanded film are uneven, because not all intervals between two adjacent LED wafers can reach a desired target interval.

Technical solutions are as follows.

A method for automatic film expansion is provided. The method includes the following. Perform overall stretching on an expanded film which is provided with evenly spaced light-emitting diode (LED) wafers on a surface of the expanded film. An interval between each two adjacent LED wafers on the expanded film is monitored in real time. In response to monitoring that an interval between two adjacent LED wafers on the expanded film is greater than or equal to a preset target interval, stop performing overall stretching, and search the expanded film for a local region where an absolute difference between an interval between two adjacent LED wafers and the preset target interval is greater than a preset error threshold. When the local region exists on the expanded film, perform local stretching on the local region until an absolute difference between an interval between each two adjacent LED wafers in the local region and the preset target interval is less than or equal to the preset error threshold.

In one implementation, performing overall stretching on the expanded film which is provided with evenly spaced LED wafers on the surface of the expanded film, and monitoring in real time an interval between each two adjacent LED wafers on the expanded film are as follows. A fixed stretching fixture is fixed on two opposite sides of the expanded film. Perform overall stretching on the expanded film. An interval between each two adjacent LED wafers on the expanded film is monitored in real time with a charge-coupled device (CCD) camera, and the monitored interval between each two adjacent LED wafers is compared with the preset target interval in real time.

In one implementation, searching the expanded film for the local region where an absolute difference between an interval between two adjacent LED wafers and the preset target interval is greater than the preset error threshold is as follows. For remaining LED wafers on the expanded film of which the interval has not been detected, an absolute difference between an interval between each two adjacent LED wafers and the preset target interval is calculated. A region of the expanded film where the absolute difference is greater than the preset error threshold is determined as the local region.

In one implementation, the method further includes the following. When no local region exists on the expanded film, stop film expansion.

In one implementation, when the local region exists on the expanded film, performing local stretching on the local region until an absolute difference between an interval between each two adjacent LED wafers in the local region and the preset target interval is less than or equal to the preset error threshold is as follows. When the local region exists on the expanded film, perform first local stretching on the local region, and monitoring in real time an interval between each two adjacent LED wafers in the local region. In response to monitoring that an interval between two adjacent LED wafers in the local region is greater than or equal to the preset target interval, stop performing first local stretching, and searching the local region for a target sub-region where an absolute difference between an interval between two adjacent LED wafers and the preset target interval is greater than the preset error threshold. When the target sub-region exists in the local region, perform $n^{th}$ local stretching on the target sub-region until an absolute difference between an interval between each two adjacent LED wafers in the target sub-region and the preset target interval is less than or equal to the preset error threshold, where n is an integer greater than or equal to 2.

In one implementation, performing local stretching on the local region is as follows. A local stretching fixture is fixed on two opposite sides of the local region, and a fixed stretching fixture and the local stretching fixture are controlled to stretch in a same direction at a same speed.

In one implementation, the overall stretching and the local stretching each include at least one of stretching in an X-axis direction and stretching in a Y-axis direction.

In one implementation, the preset error threshold is 1% to 5% of the preset target interval.

A storage medium is provided. The computer readable storage medium is configured to store a plurality of instructions which are loaded by a processor and configured to execute the operations of the method for automatic film expansion.

A device for automatic film expansion is provided. The device includes a fixed stretching fixture, a local stretching fixture, a CCD camera, a driving mechanism, and a controller. The CCD camera and the driving mechanism are electrically coupled with the controller. The controller includes a processor configured to implement instructions and a storage medium configured to store a plurality of instructions. The instructions are loaded by the processor and configured to execute the operations of the method for automatic film expansion.

Advantageous effects: according to the disclosure, perform local stretching on the local region of the expanded film where an absolute difference between an interval between two adjacent LED wafers and the preset target interval is greater than the preset error threshold, so as to realize that an absolute difference between an interval between each two adjacent LED wafers on the expanded film and the preset target interval is less than or equal to the preset error threshold. As such, problems of not meeting CSP production and use requirements due to relatively large absolute differences between the preset target interval and intervals between two adjacent LED wafers can be avoided.

DETAILED DESCRIPTION

In order to clearly and accurately describe the objects, technical solutions, and advantages of the disclosure, the disclosure will be described below in details with reference to accompanying drawings and implementations. It should be understood that, specific implementations herein are merely used to explain the disclosure, and should not be construed as limiting the disclosure.

Figure 1:
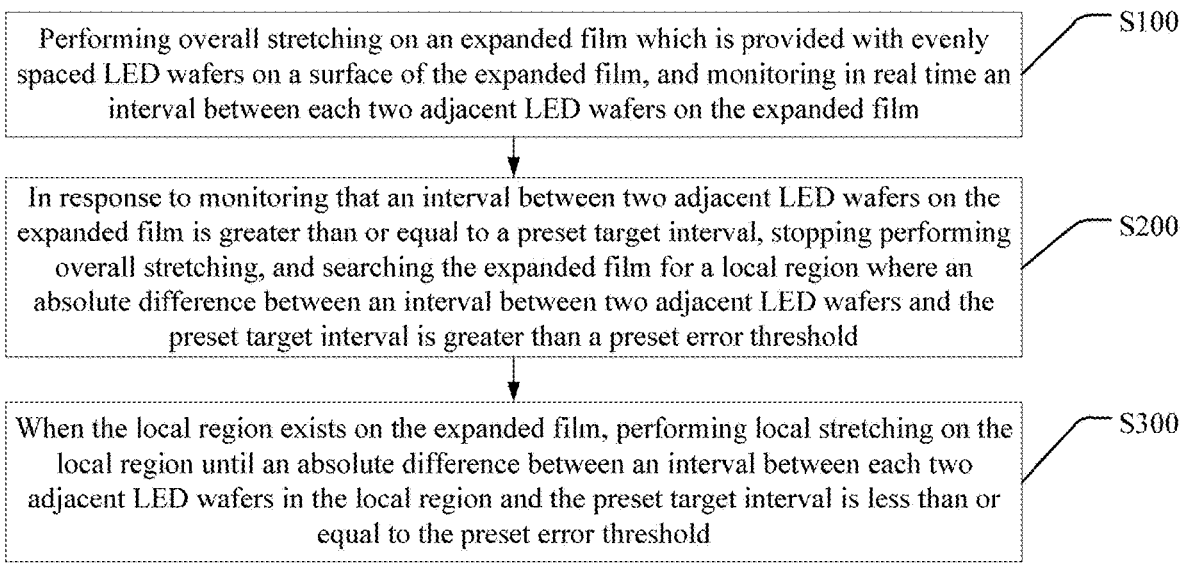
FIG. 1 is a schematic flowchart illustrating a method for automatic film expansion according to some implementations.

FIG. 1 is a schematic flowchart illustrating a method for changing wafer intervals according to exemplary implementations of the disclosure. As illustrated in FIG. 1, the method includes the following.

At block S100, perform overall stretching on an expanded film which is provided with evenly spaced light-emitting diode (LED) wafers on a surface of the expanded film, and an interval between each two adjacent LED wafers on the expanded film is monitored in real time.

At block S200, in response to monitoring that an interval between two adjacent LED wafers on the expanded film is greater than or equal to a preset target interval, stop performing overall stretching, and search the expanded film for a local region where an absolute difference between an interval between two adjacent LED wafers and the preset target interval is greater than a preset error threshold.

At block S300, when the local region exists on the expanded film, perform local stretching on the local region until an absolute difference between an interval between each two adjacent LED wafers in the local region and the preset target interval is less than or equal to the preset error threshold.

In these implementations, the expanded film is provided with LED wafers arranged at equal intervals. During the overall stretching performed on the expanded film, due to different positions of LED wafers on the expansion film, change rates of intervals of the LED wafers caused by the stretching are different. As a result, when the overall stretching performed on the expanded film is stopped, due to different change rates of intervals, only intervals between some LED wafers on the expanded film can reach the preset target interval, while intervals between remaining LED wafers on the expanded film have certain differences with respect to the preset target interval.

When the overall stretching performed on the expanded film is stopped, perform local stretching on the local region where an absolute difference between an interval between two adjacent LED wafers and the preset target interval is greater than the preset error threshold. In this way, an absolute difference between an interval between each two adjacent LED wafers on the expanded film and the preset target interval less than or equal to the preset error threshold can be realized. Therefore, problems of not meeting CSP production and use requirements due to relatively large absolute differences between intervals between two adjacent LED wafers and the preset target interval can be avoided. In these implementations, the absolute difference between an interval between two adjacent LED wafers and the preset target interval refers to an absolute value of a difference between an interval of two adjacent LED wafers and the preset target interval.

In some implementations, a fixed stretching fixture is fixed on two opposite sides of the expanded film to perform overall stretching on the expanded film. An interval between each two adjacent LED wafers on the expanded film is monitored in real time with a CCD camera. The monitored interval between each two adjacent LED wafers is compared with the preset target interval in real time.

Figure 2:
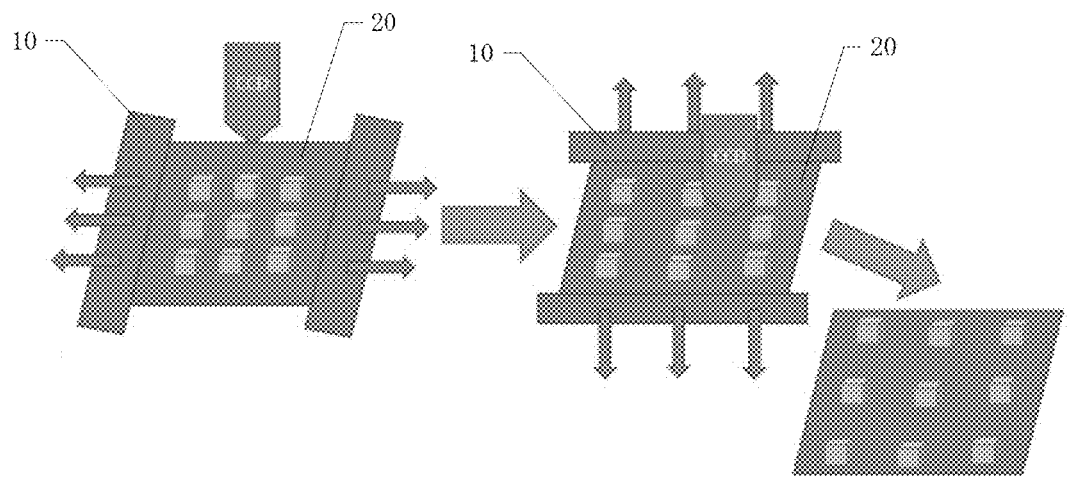
FIG. 2 is a schematic diagram illustrating overall stretching according to some implementations.

In these implementations, the overall stretching includes at least one of stretching in an X-axis direction and stretching in a Y-axis direction. As illustrated in FIG. 2, the expanded film can be stretched in the X-axis direction, and then stretched in the Y-axis direction, so that an interval between each two adjacent LED wafers on the expanded film reaches the preset target interval in both the X-axis direction and the Y-axis direction, thereby meeting requirements of CSP production and use.

As illustrated in FIG. 2, when the expanded film needs to be stretched as a whole in the X-axis direction, two fixed stretching fixtures 10 are fixed to the left and right sides of an expanded film 20. Then the left fixed stretching fixture 10 is driven by a driving mechanism to stretch (the expanded film) to the left at a constant speed and the right fixed stretching fixture 10 is driven by the driving mechanism to stretch (the expanded film) to the right at the constant speed, to adjust an interval between adjacent LED wafers on the expanded film in the X-axis direction. When the expanded film needs to be stretched as a whole in the Y-axis direction, two fixed stretching fixtures 10 are fixed to the upper and lower sides of the expanded film 20. Then the upper fixed stretching fixture 10 is driven by a driving mechanism to stretch (the expanded film) at a constant speed in an upward direction and the lower fixed stretching fixture 10 is driven by the driving mechanism to stretch (the expanded film) at the constant speed in a downward direction, to adjust an interval between adjacent LED wafers on the expanded film in the Y-axis direction.

In these implementations, the overall stretching of the expanded film provided with LED wafers is performed by the fixed stretching fixture. As stretching time elapses, an interval between two adjacent LED wafers on the expanded film (in a stretching direction) also increases. An interval between each two adjacent LED wafers on the expanded film is monitored in real time with the CCD camera. The monitored interval between each two adjacent LED wafers is compared with the preset target interval in real time. Whether to stop the overall stretching is determined according to a comparison result.

In some implementations, in response to monitoring that an interval between two adjacent LED wafers on the expanded film is greater than or equal to a preset target interval, stop performing overall stretching. For remaining LED wafers on the expanded film of which the interval has not been detected, an absolute difference between an interval between each two adjacent LED wafers and the preset target interval is calculated. A region of the expanded film where the absolute difference is greater than the preset error threshold is determined as the local region.

In these implementations, in response to monitoring that an interval between two adjacent LED wafers on the expanded film is greater than or equal to the preset target interval, stop performing overall stretching. Since change rates of intervals between LED wafers which are distributed at different positions of the expanded film are different during the overall stretching, intervals between some adjacent LED wafers on the expanded film are the same as the preset target interval, while intervals between remaining adjacent LED wafers do not reach the preset target interval due to different distribution positions. As a result, not all the LED wafers on the expanded film can be arranged at equal intervals after overall stretching, so that intervals between the LED wafers on the expanded film are uneven. Therefore, in these implementations, for remaining LED wafers on the expanded film of which the interval has not been detected, an absolute difference between an interval between each two adjacent LED wafers on the expanded film and the preset target interval is further calculated, and a region of the expanded film where the absolute difference is greater than the preset error threshold is recorded as the local region, so as to perform local stretching on the local region in subsequent operations, which can realize that an interval between each two adjacent LED wafers on the expanded film reaches the desired preset target interval, and so intervals between LED wafers on the expanded film are even.

In some implementations, when the local region exists on the expanded film, perform local stretching on the local region until an absolute difference between an interval between each two adjacent LED wafers in the local region and the preset target interval is less than or equal to the preset error threshold. When no local region exists on the expanded film, stop film expansion.

Figure 3:
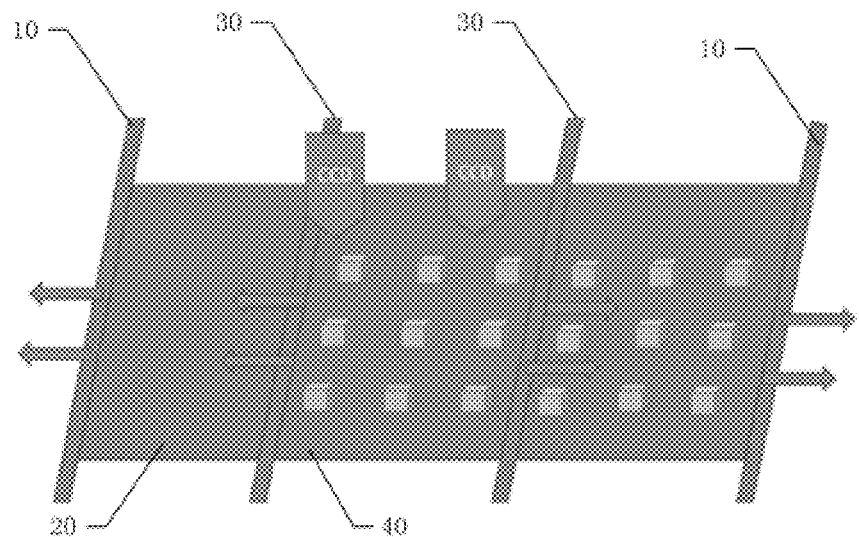
FIG. 3 is a schematic diagram illustrating local stretching according to some implementations.

In these implementations, the local stretching also includes at least one of stretching in an X-axis direction and stretching in a Y-axis direction. As illustrated in FIG. 3, when the local region of the expanded film needs to be stretched in the X-axis direction, two fixed stretching fixtures 10 are fixed to the left and right sides of the expanded film (i.e., the same position as when performing overall stretching), and two local stretching fixtures 30 are fixed to the left and right sides of a local region 40, to control the fixed stretching fixture 10 and the local stretching fixture 30 on the left side of the local region to stretch to the left at a same and constant speed, and control the fixed stretching fixture 10 and the local stretching fixture 30 on the right side of the local region to stretch to the right at a same and constant speed. A stretching speed of the local stretching fixture 30 to the left is the same as a stretching speed of the local stretching fixture 30 to the right. According to the local stretching manner provided in the implementations, an interval between two adjacent LED wafers in the local region can be increased without changing an interval between two adjacent LED wafers in other regions of the expanded film (i.e., regions except for the local region). In addition, according to the method of the implementations, a case where LED wafers in the local region of the expanded film touches LED wafers in other regions of the expanded film can also avoided.

In some implementations, when the local region exists on the expanded film, performing local stretching on the local region until an absolute difference between an interval between each two adjacent LED wafers in the local region and the preset target interval is less than or equal to the preset error threshold is as follows. When the local region exists on the expanded film, perform first local stretching on the local region. An interval between each two adjacent LED wafers in the local region is monitored in real time. In response to monitoring that an interval between two adjacent LED wafers in the local region is greater than or equal to the preset target interval, stop performing first local stretching, and search the local region for a target sub-region where an absolute difference between an interval between two adjacent LED wafers and the preset target interval is greater than the preset error threshold. When the target sub-region exists in the local region, perform $n^{th}$ local stretching on the target sub-region until an absolute difference between an interval between each two adjacent LED wafers in the target sub-region and the preset target interval is less than or equal to the preset error threshold, where n is an integer greater than or equal to 2.

In some implementations, the preset error threshold is 1% to 5% of the preset target interval. The preset error threshold is 5% of the preset target interval for example. If the preset target interval is 100 microns, the preset error threshold is 5 microns. In these implementations, after performing overall stretching on the expanded film, if there are still regions where an interval between two adjacent LED wafers is less than 95 microns, all the regions of the expanded film where an interval between two adjacent LED wafers is less than 95 microns are recorded as a local region, and perform at least one local stretching on the local region, so that an interval between each two adjacent LED wafers in the local region is greater than 95 microns. In this case, the local stretching is stopped.

In these implementations, perform local stretching on a newly determined second region. Both a local stretching process and an overall stretching process are detected in real time by detecting, with the CCD camera, intervals between two adjacent LED wafers during stretching. During the local stretching, only an interval between each two adjacent LED wafers in the second region currently undergoing local stretching needs to be detected, without detecting an interval between each two adjacent LED wafers on the whole expanded film. During the local stretching, in response to detecting an interval between two adjacent LED wafers in the second region reaches the target interval, stop performing the local stretching. The size of an interval between each two adjacent LED wafers in the second region when the stretching is stopped is detected. A new error value between the detected interval and the target interval is calculated and obtained. The new error value is compared with the error threshold again. If all the new error values are less than the error threshold, it means that adjustment of intervals between two adjacent LED wafers is completed, and so the stretching is stopped. If there is still a new error value greater than the error threshold, it means that intervals between two adjacent LED wafers need further adjusted. A region where an error value of an interval between two adjacent LED is greater than the error threshold is determined as a new second region. Then perform local stretching on the new second region.

In some implementations, a storage medium is further provided. The storage medium stores a plurality of instructions. The instructions are loaded by a processor and configured to execute the operations of the method for automatic film expansion of the disclosure.

Figure 4:
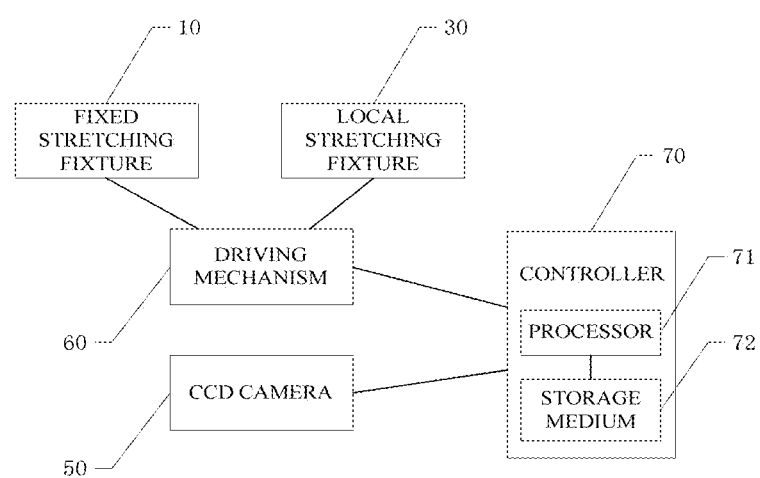
FIG. 4 is a schematic structural diagram illustrating a device for automatic film expansion according to some implementations.

In some implementations, a device for automatic film expansion is further provided. As illustrated in FIG. 4, the device includes a fixed stretching fixture 10, a local stretching fixture 30, a CCD camera 50, a driving mechanism 60, and a controller 70. The fixed stretching fixture 10 and the local stretching fixture 30 are electrically coupled with the driving mechanism 60. The CCD camera 50 and the driving mechanism 60 are electrically coupled with the controller 70. The controller 70 includes a processor 71 configured to implement various instructions and a storage medium 72 configured to store a plurality of instructions. The instructions are loaded by the processor 71 and configured to execute the operations of the method for automatic film expansion of the disclosure.

In these implementations, the controller 70 is configured to send a monitoring instruction to the CCD camera to control the CCD camera to monitor an interval between adjacent LED wafers on the expanded film in real time. The controller 70 is configured to send a driving instruction to control starting of the driving mechanism 60, so that the fixed stretching fixture 10 is driven to perform overall stretching on the expanded film, and the local stretching fixture 30 is driven to perform local stretching on the expanded film.

In sum, according to the disclosure, perform local stretching on the local region where an absolute difference between an interval between two adjacent LED wafers on the expanded film and the preset target interval is greater than the preset error threshold, so that an absolute difference between an interval between each two LED wafers on the expanded film and the preset target interval is less than or equal to the preset error threshold, which avoids the problems of not meeting CSP production and use requirements due to relatively large absolute differences between intervals between two adjacent LED wafers and the preset target interval.

It is to be understood that, the disclosure is not limited to foregoing illustrative implementations. Those of ordinary skill in the art are able to make several improvements and changes, and these improvements and changes are also deemed as falling in the protection scope of the disclosure.

What is claimed is:

1. A method for automatic film expansion, comprising:
   performing overall stretching on an expanded film which is provided with evenly spaced light-emitting diode (LED) wafers on a surface of the expanded film, and monitoring in real time an interval between each two adjacent LED wafers on the expanded film;
   in response to monitoring that an interval between two adjacent LED wafers on the expanded film is greater than or equal to a preset target interval, stopping performing overall stretching, and determining a local region where an absolute difference between an interval between two adjacent LED wafers and the preset target interval is greater than a preset error threshold; and
   performing local stretching on the local region until an absolute difference between an interval between each two adjacent LED wafers in the local region and the preset target interval is less than or equal to the preset error threshold.

2. The method of claim 1, wherein performing overall stretching on the expanded film which is provided with evenly spaced LED wafers on the surface of the expanded film, and monitoring in real time the interval between each two adjacent LED wafers on the expanded film comprise:
   fixing a fixed stretching fixture on two opposite sides of the expanded film, and performing overall stretching on the expanded film; and
   monitoring, with a charge-coupled device (CCD) camera, in real time the interval between each two adjacent LED wafers on the expanded film, and comparing in real time the monitored interval between each two adjacent LED wafers with the preset target interval.

3. The method of claim 2, wherein determining the local region where an absolute difference between the interval between two adjacent LED wafers and the preset target interval is greater than the preset error threshold comprises:
   for remaining LED wafers on the expanded film of which the interval has not been detected, calculating an absolute difference between the interval between each two adjacent LED wafers and the preset target interval; and
   determining a region of the expanded film where the absolute difference is greater than the preset error threshold as the local region.

4. The method of claim 1, further comprising:
   stopping film expansion when no local region exists on the expanded film.

5. The method of claim 3, wherein performing local stretching on the local region until an absolute difference between the interval between each two adjacent LED wafers in the local region and the preset target interval is less than or equal to the preset error threshold comprises:
   performing first local stretching on the local region, and monitoring in real time the interval between each two adjacent LED wafers in the local region;
   in response to monitoring that the interval between two adjacent LED wafers in the local region is greater than or equal to the preset target interval, stopping performing first local stretching, and searching the local region for a target sub-region where an absolute difference between an interval between two adjacent LED wafers and the preset target interval is greater than the preset error threshold; and
   when the target sub-region exists in the local region, performing $n^{th}$ local stretching on the target sub-region until an absolute difference between an interval between each two adjacent LED wafers in the target sub-region and the preset target interval is less than or equal to the preset error threshold, wherein n is an integer greater than or equal to 2.

6. The method of claim 1, wherein performing local stretching on the local region comprises:

fixing a local stretching fixture on two opposite sides of the local region, and controlling a fixed stretching fixture and the local stretching fixture to stretch in a same direction at a same speed.

7. The method of claim 1, wherein the overall stretching and the local stretching each comprise at least one of stretching in an X-axis direction and stretching in a Y-axis direction.

8. The method of claim 1, wherein the preset error threshold is a value within 1% to 5% of the preset target interval.

9. A non-transitory storage medium, storing a plurality of instructions which, when executed by a processor, cause the processor to carry out actions, comprising:
performing overall stretching on an expanded film which is provided with evenly spaced light-emitting diode (LED) wafers on a surface of the expanded film, and monitoring in real time an interval between each two adjacent LED wafers on the expanded film;
in response to monitoring that an interval between two adjacent LED wafers on the expanded film is greater than or equal to a preset target interval, stopping performing overall stretching, and determining a local region where an absolute difference between an interval between two adjacent LED wafers and the preset target interval is greater than a preset error threshold; and
performing local stretching on the local region until an absolute difference between an interval between each two adjacent LED wafers in the local region and the preset target interval is less than or equal to the preset error threshold.

10. The non-transitory storage medium of claim 9, wherein the instructions executed by the processor to carry out the action of performing overall stretching on the expanded film which is provided with evenly spaced LED wafers on the surface of the expanded film, and monitoring in real time the interval between each two adjacent LED wafers on the expanded film are executed by the processor to carry out actions, comprising:
fixing a fixed stretching fixture on two opposite sides of the expanded film, and performing overall stretching on the expanded film; and
monitoring, with a charge-coupled device (CCD) camera, in real time the interval between each two adjacent LED wafers on the expanded film, and comparing in real time the monitored interval between each two adjacent LED wafers with the preset target interval.

11. The non-transitory storage medium of claim 10, wherein the instructions executed by the processor to carry out the action of determining the local region where an absolute difference between the interval between two adjacent LED wafers and the preset target interval is greater than the preset error threshold are executed by the processor to carry out actions, comprising:
for remaining LED wafers on the expanded film of which the interval has not been detected, calculating an absolute difference between the interval between each two adjacent LED wafers and the preset target interval; and
determining a region of the expanded film where the absolute difference is greater than the preset error threshold as the local region.

12. The non-transitory storage medium of claim 11, wherein the instructions executed by the processor to carry out the action of performing local stretching on the local region until an absolute difference between the interval between each two adjacent LED wafers in the local region and the preset target interval is less than or equal to the preset error threshold are executed by the processor to carry out actions, comprising:
performing first local stretching on the local region, and monitoring in real time the interval between each two adjacent LED wafers in the local region;
in response to monitoring that the interval between two adjacent LED wafers in the local region is greater than or equal to the preset target interval, stopping performing first local stretching, and searching the local region for a target sub-region where an absolute difference between an interval between two adjacent LED wafers and the preset target interval is greater than the preset error threshold; and
when the target sub-region exists in the local region, performing nth local stretching on the target sub-region until an absolute difference between an interval between each two adjacent LED wafers in the target sub-region and the preset target interval is less than or equal to the preset error threshold, wherein n is an integer greater than or equal to 2.

13. A device for automatic film expansion, comprising:
a fixed stretching fixture;
a local stretching fixture;
a charge-coupled device (CCD) camera;
a driving mechanism; and
a controller;
the fixed stretching fixture and the local stretching fixture being electrically coupled with the driving mechanism;
the CCD camera and the driving mechanism being electrically coupled with the controller;
the controller comprising a processor configured to implement instructions and a storage medium configured to store a plurality of instructions; and
the instructions, when executed by the processor, being operable with the processor to:
perform overall stretching on an expanded film which is provided with evenly spaced light-emitting diode (LED) wafers on a surface of the expanded film, and monitor in real time an interval between each two adjacent LED wafers on the expanded film;
in response to monitoring that an interval between two adjacent LED wafers on the expanded film is greater than or equal to a preset target interval, stop performing overall stretching, and determine a local region where an absolute difference between an interval between two adjacent LED wafers and the preset target interval is greater than a preset error threshold; and
perform local stretching on the local region until an absolute difference between an interval between each two adjacent LED wafers in the local region and the preset target interval is less than or equal to the preset error threshold.

14. The device of claim 13, wherein the instructions operable with the processor to perform overall stretching on the expanded film which is provided with evenly spaced LED wafers on the surface of the expanded film, and monitor in real time the interval between each two adjacent LED wafers on the expanded film are operable with the processor to:
fix the fixed stretching fixture on two opposite sides of the expanded film, and perform overall stretching on the expanded film; and
monitor, with the CCD camera, in real time the interval between each two adjacent LED wafers on the expanded film, and compare in real time the monitored interval between each two adjacent LED wafers with the preset target interval.

15. The device of claim 14, wherein the instructions operable with the processor to determine the local region where an absolute difference between the interval between two adjacent LED wafers and the preset target interval is greater than the preset error threshold are operable with the processor to:

for remaining LED wafers on the expanded film of which the interval has not been detected, calculate an absolute difference between the interval between each two adjacent LED wafers and the preset target interval; and determine a region of the expanded film where the absolute difference is greater than the preset error threshold as the local region.

16. The device of claim 13, wherein the instructions are further operable with the processor to:

stop film expansion when no local region exists on the expanded film.

17. The device of claim 15, wherein the instructions operable with the processor to perform local stretching on the local region until an absolute difference between the interval between each two adjacent LED wafers in the local region and the preset target interval is less than or equal to the preset error threshold are operable with the processor to:

perform first local stretching on the local region, and monitor in real time the interval between each two adjacent LED wafers in the local region;

in response to monitoring that the interval between two adjacent LED wafers in the local region is greater than or equal to the preset target interval, stop performing first local stretching, and search the local region for a target sub-region where an absolute difference between an interval between two adjacent LED wafers and the preset target interval is greater than the preset error threshold; and when the target sub-region exists in the local region, perform $n^{th}$ local stretching on the target sub-region until an absolute difference between an interval between each two adjacent LED wafers in the target sub-region and the preset target interval is less than or equal to the preset error threshold, wherein n is an integer greater than or equal to 2.

18. The device of claim 13, wherein the instructions operable with the processor to perform local stretching on the local region are operable with the processor to:

fix the local stretching fixture on two opposite sides of the local region, and control the fixed stretching fixture and the local stretching fixture to stretch in a same direction at a same speed.

19. The device of claim 13, wherein the overall stretching and the local stretching each comprise at least one of stretching in an X-axis direction and stretching in a Y-axis direction.

20. The device of claim 13, wherein the preset error threshold is a value within 1% to 5% of the preset target interval.

* * * * *